US012765117B2

(12) United States Patent
Yan et al.

(10) Patent No.: US 12,765,117 B2
(45) Date of Patent: Oct. 13, 2026

(54) IMAGE SENSOR AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Dayong Yan, Beijing (CN); Changcheng Gao, Beijing (CN); Qiang Shi, Beijing (CN); Wei Zhang, Beijing (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 372 days.

(21) Appl. No.: 18/405,661

(22) Filed: Jan. 5, 2024

(65) Prior Publication Data

US 2024/0234599 A1 Jul. 11, 2024

(30) Foreign Application Priority Data

Jan. 10, 2023 (CN) ........................ 202310033265.0

(51) Int. Cl.
*H01L 31/0236* (2006.01)
*H01L 31/0288* (2006.01)
(Continued)

(52) U.S. Cl.
CPC ......... *H10F 77/707* (2025.01); *H10F 71/121* (2025.01); *H10F 71/128* (2025.01); *H10F 77/1223* (2025.01)

(58) Field of Classification Search
CPC .... H10F 77/707; H10F 71/121; H10F 71/128; H10F 77/1223; H10F 30/21; H10F 39/18; H10F 39/011
(Continued)

(56) References Cited

U.S. PATENT DOCUMENTS 5,920,346 A * 7/1999 Nakashiba ............ H10F 39/153 257/E27.154
2009/0166777 A1 * 7/2009 Lee ....................... H10F 39/014 257/431
(Continued)

*Primary Examiner* — Tong-Ho Kim
(74) *Attorney, Agent, or Firm* — Anova Law Group, PLLC

(57) ABSTRACT

An image sensor includes a first substrate and a photoelectric structure in the first substrate. The first substrate includes opposite first surface and second surfaces. The conductivity type of the photoelectric structure is opposite to that of the first substrate. The photoelectric structure includes a second doped region and multiple first doped regions. Each of the first doped regions is connected to the second doped region. The distance from the second doped region to the first surface is smaller than the distance from the first doped region to the first surface. The size of the first doped region in a direction parallel to the first surface is smaller than or equal to the size of the second doped region in the direction. The quantum efficiency (QE), detection band, and photosensing capability are improved.

20 Claims, 6 Drawing Sheets

(51) Int. Cl.

| | |
|---|---|
| ***H01L 31/18*** | (2006.01) |
| ***H10F 71/00*** | (2025.01) |
| ***H10F 77/1223*** | (2025.01) |
| ***H10F 77/70*** | (2025.01) |

(58) Field of Classification Search

USPC .......................................................... 257/431

See application file for complete search history.

(56) References Cited

U.S. PATENT DOCUMENTS

| | | | | |
|---|---|---|---|---|
| 2011/0001038 | A1* | 1/2011 | Tseng | H10F 39/806<br>438/73 |
| 2013/0320420 | A1* | 12/2013 | Kao | H10F 39/199<br>257/292 |
| 2014/0183497 | A1* | 7/2014 | Shinotsuka | H10K 77/10<br>438/22 |
| 2017/0200758 | A1* | 7/2017 | Jung | H10F 39/18 |
| 2018/0337211 | A1* | 11/2018 | Su | H10F 39/024 |
| 2018/0350853 | A1* | 12/2018 | Huang | H10F 39/199 |
| 2020/0098803 | A1* | 3/2020 | Lo | H10F 39/80377 |
| 2021/0265514 | A1* | 8/2021 | Liu | H10F 39/8027 |

* cited by examiner

IMAGE SENSOR AND FABRICATION METHOD THEREOF

CROSS-REFERENCE TO RELATED APPLICATION

This application claims the priority of Chinese patent application Ser. No. 202310033265.0, filed on Jan. 10, 2023, the content of which is incorporated herein by reference in its entirety.

TECHNICAL FIELD

The present disclosure generally relates to the field of semiconductor technology and, more particularly, relates to image sensors and fabrication methods thereof.

BACKGROUND

Image sensors use the photoelectric conversion function of an optoelectronic device to convert a light image on a photo-sensing surface into electrical signals that are proportional to the intensity of the light image. Specifically, image sensors divide a received light image into many small units and convert them into usable electrical signals.

For image sensors, the quantum efficiency (QE) is an important parameter that measures a sensor's ability to perform photoelectric conversion. QE can accurately describe the light-sensing capability of an image sensor. Factors affecting the QE of an image sensor include the state of the photo-sensing surface of the image sensor, reflection of light on the surface, absorption of light by a dielectric layer, and the location of the photon-absorbing structure in the image sensor, etc. Since light of different wavelengths has different reflection and different absorption depths on a surface of a device, image sensors are usually developed accordingly for a specific wavelength range required by a photoelectric detection scenario.

However, in the existing technology, a wavelength range that an image sensor can detect is still greatly limited. There is a need for improvement of the QE and improvement of the photo-sensing capability of a device. The disclosed structures and methods are directed to at least partially alleviate one or more problems set forth above and to solve other problems in the art.

SUMMARY

One aspect of the present disclosure provides an image sensor. The image sensor includes a first substrate and a photoelectric structure in the first substrate. The first substrate includes a first surface and a second surface that are opposite to each other. A conductivity type of the photoelectric structure is opposite to a conductivity type of the first substrate. The photoelectric structure includes a second doped region and multiple first doped regions. Each of the first doped regions is connected to the second doped region. A distance from the second doped region to the first surface is smaller than a distance from one of the first doped regions to the first surface. A size of the first doped regions in a direction parallel to the first surface of the first substrate is smaller than or equal to a size of the second doped region in the direction parallel to the first surface of the first substrate.

Another aspect of the present disclosure provides a method for forming an image sensor. The method includes providing a first substrate and forming a photoelectric structure in the first substrate. The first substrate includes a first surface and a second surface that are opposite to each other. A conductivity type of the photoelectric structure is opposite to a conductivity type of the first substrate. The photoelectric structure includes a second doped region and multiple first doped regions. Each of the first doped regions is connected to the second doped region. A distance from the second doped region to the first surface is smaller than a distance from one of the first doped regions to the first surface. A size of the first doped regions in a direction parallel to the first surface of the first substrate is smaller than or equal to a size of the second doped region in the direction parallel to the first surface of the first substrate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
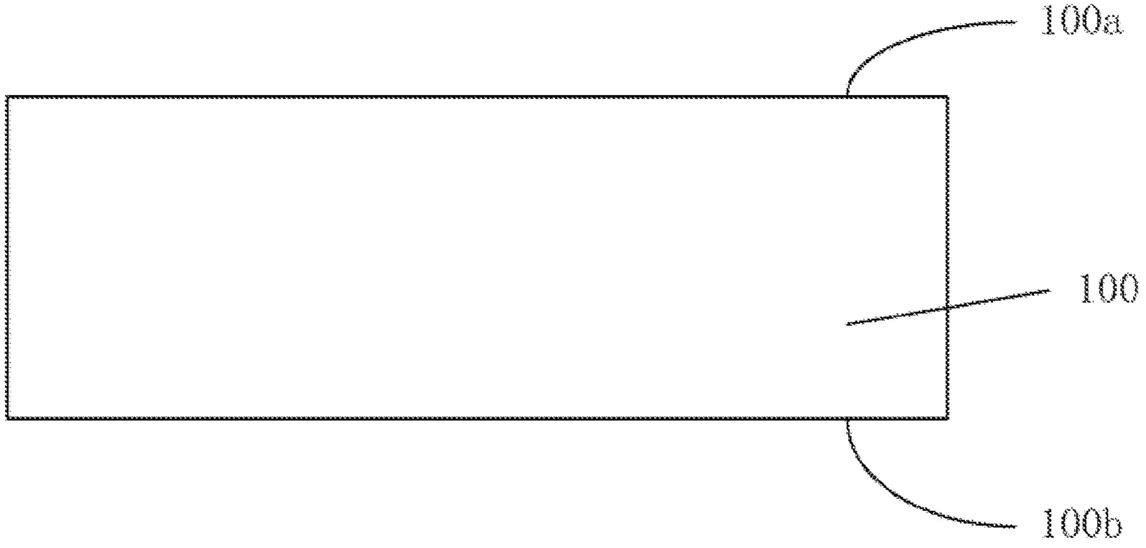
FIGS. 1-5 are structural diagrams illustrating a formation process of an exemplary image sensor according to some embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

The present disclosure provides an image sensor and a method of forming the same. It may improve the QE of the image sensor, broaden a wavelength band that the image sensor can detect, and improve its photo-sensing capability. As used herein, terms "wavelength band" and "wavelength range" have the same meaning and may be used interchangeably.

The image sensor includes a first substrate and a photoelectric structure formed in the first substrate. The first substrate includes a first surface and a second surface that are opposite to each other. The conductivity type of the photoelectric structure is opposite to that of the first substrate. The photoelectric structure includes a second doped region and multiple first doped regions. Each of the first doped regions is connected to the second doped region. The distance from the second doped region to the first surface is smaller than the distance from the first doped region to the first surface. The size of the first doped region in a direction parallel to the first surface of the first substrate is smaller than or equal to the size of the second doped region in the direction parallel to the first surface of the first substrate.

Optionally, the image sensor further includes micro-grooves located on the second surface of the first substrate. The bottom surface of the micro-grooves is parallel to the second surface, convex toward the second surface, or convex toward the first surface.

Optionally, projection patterns of the micro-grooves on the first surface of the first substrate may be the same in some cases. Projection patterns of the micro-grooves on the first surface of the first substrate may be different in some other cases. Projection patterns of the micro-grooves on the first surface of the first substrate include a rectangle, a square, or an annular shape.

Optionally, the surface of the first doped region away from the second doped region is a first doped surface. The first doped surface is parallel to the first surface or convex toward the second surface.

Optionally, projection patterns of the first doped regions on the first surface of the first substrate may be the same in some cases. Projection patterns of the first doped regions on the first surface of the first substrate may be different in some other cases. Projection patterns of the first doped regions on the first surface of the first substrate include a rectangle, a square, or an annular shape.

Optionally, the projection pattern of the first doped region on the first surface of the first substrate is a first image. The projection pattern of the micro-groove on the first surface of the first substrate is a second image. The first and second images may completely overlap in some cases, partially overlap in some other cases, or not overlap in some further cases.

A method of forming the image sensor illustrated above includes providing a first substrate and forming a photoelectric structure in the first substrate. The first substrate includes a first surface and a second surface that are opposite to each other. The conductivity type of the photoelectric structure is opposite to that of the first substrate. The photoelectric structure includes a second doped region and multiple first doped regions. Each of the first doped regions is connected to the second doped region. The distance from the second doped region to the first surface is smaller than the distance from the first doped region to the first surface. The size of the first doped region in a direction parallel to the first surface of the first substrate is smaller than or equal to the size of the second doped region in the direction parallel to the first surface of the first substrate.

Optionally, the surface of the first doped region away from the second doped region is a first doped surface, and the first doped surface is parallel to the first surface or convex toward the second surface.

Optionally, projection patterns of the first doped regions on the first surface of the first substrate may be the same in some cases. Projection patterns of the first doped regions on the first surface of the first substrate may be the different in some other cases.

Optionally, projection patterns of the first doped regions on the first surface of the first substrate include rectangles. The long sides of the rectangles are parallel or perpendicular to each other.

Optionally, projection patterns of the first doped regions on the first surface of the first substrate include a square or annular shape.

Optionally, a formation method of the photoelectric structure includes forming first initial doped regions on the first surface of the first substrate through a first ion implantation process, annealing the first initial doped regions to form first doped regions, forming a second initial doped region on the first surface of the first substrate through a second ion implantation process, annealing the second initial doped region to form a second doped region. The ion implantation energy of the first ion implantation process is different from that of the second ion implantation process.

Optionally, parameters of the first ion implantation process include an ion implantation dose of 4E12 ions/$cm^2$~6E12 ions/$cm^2$ and ion implantation energy of 450 KeV~550 keV. Parameters of the second ion implantation process include an ion implantation dose of 4E12 ions/$cm^2$~6E12 ions/$cm^2$ and ion implantation energy of 150 KeV~250 KeV.

Optionally, when the first doped surface of the first doped region is parallel to the first surface, parameters for annealing the first initial doped regions include an annealing time of 5 seconds to 15 seconds and an annealing temperature of 700 to 900 degrees Celsius. When the first doped surface of the first doped region is convex toward the second surface, parameters for annealing the first initial doped regions include an annealing time of 5 to 15 seconds and an annealing temperature of 900 to 1100 degrees Celsius.

Optionally, the method of forming the image sensor further includes forming micro-grooves on the second surface of the first substrate. The sidewall surface of the micro-grooves is perpendicular to the second surface of the first substrate. The bottom surface of the micro-grooves is parallel to the second surface, convex toward the second surface, or convex toward the first surface.

Optionally, the projection pattern of the first doped region on the first surface of the first substrate is a first pattern, and the projection pattern of the micro-groove on the first surface of the first substrate is a second pattern. The first and second patterns may completely overlap in some cases, partially overlap in some other cases, or not overlap in some further cases.

Optionally, the process of forming the micro-grooves includes an anisotropic dry etch process. The etching gas of the dry etch process includes a fluorocarbon mixture.

Optionally, when the bottom surface of the micro-grooves is parallel to the second surface, the carbon to fluorine ratio in the etching gas ranges from 1:1.5 to 1:2. When the bottom surface of the micro-grooves is convex toward the second surface, the carbon to fluorine ratio in the etching gas ranges from 1:2 to 1:4. When the bottom surface of the micro-grooves is convex toward the first surface, the carbon to fluorine ratio in the etching gas ranges from 1:1 to 1:1.5.

Optionally, projection patterns of the micro-grooves on the first surface of the first substrate may be the same in some cases and different in some other cases. The projection patterns of the micro-groove on the first surface of the first substrate include a rectangle, a square, or an annular shape.

Optionally, after forming the micro-grooves, the method further includes filling the micro-grooves with a first oxide layer and a dielectric layer located on the first oxide layer.

Optionally, the second surface of the first substrate is flat.

Compared with the existing technology, the technical solution of the present disclosure has the following advantages:

As illustrated above, the photoelectric structure includes the second doped region and multiple first doped regions. The first doped regions are on the surface of the second doped region. The size of the first doped region in a direction parallel to the first surface of the first substrate is smaller than or equal to the size of the second doped region in the direction parallel to the first surface of the first substrate. As such, the PN junction area between the photoelectric structure and the first substrate is increased, the QE is increased, and the sensitivity of the image sensor is improved.

Further, since the number, shape, and form of the bottom surface of the first doped regions may be arranged in a variety of ways, the optical path for photon absorption in the photodiode of the image sensor may be flexibly controlled. The photon absorption rate of the photodiode may be optimized. The QE may be improved. In addition, since the optical path at the photo-sensing surface may be controlled, the wavelength band that the image sensor can detect is broadened. Higher QE in a wider band may be achieved. The device performance may be improved.

Further, micro-grooves are formed on the second surface of the first substrate. The bottom surface of the micro-groove may be parallel to the second surface, convex toward the second surface, or convex toward the first surface. The surface form of the micro-grooves has many possibilities. Projection patterns of the first doped regions and micro-grooves on the first surface of the first substrate may completely overlap, partially overlap, or have no overlap in various cases. Therefore, the combination of the first doped regions and the micro-grooves may have many possibilities. The optical path on the photo-sensing surface of the image sensor may be flexibly controlled. The QE of the device may be optimized. The wavelength band that the image sensor can detect may be broadened. The device may have higher QE in a wider wavelength band.

Further, the second surface of the first substrate may not undergo any backside process in some embodiments. The QE of the device may be effectively improved. It may avoid substrate damages caused by the backside process, reduce the dark current, and improve the device performance.

At the image sensor provided by the present disclosure, the photoelectric structure includes a second doped region and multiple first doped regions. The first doped region is located on the surface of the second doped region. The size of the first doped regions in a direction parallel to the first surface of the first substrate is smaller than or equal to the size of the second doped region in the direction parallel to the first surface of the first substrate. The PN junction area between the photoelectric structure and the first substrate is increased. The QE of the device is increased. The sensitivity of the image sensor is improved.

As aforementioned, factors affecting the QE of an image sensor may include the state of the photo-sensing surface of the image sensor, and the location of the photon-absorbing structure in the image sensor, etc. In the existing technology, groove structures on the photo-sensing surface of an image sensor are formed to increase the optical path of the incident light. The QE of the device may be improved. However, the groove structures are currently formed through an isotropic wet etching process, which has weak control over the etch direction and etch rate. As a result, there are fewer choices for the form of the groove structure, and there are many structural defects on the photo-sensing surface. It makes it difficult for QE optimization and affects the device performance. It also limits the wavelength range and the photo-sensing capability of the device.

In order to solve the above technical problems, the present disclosure provides a method for forming an image sensor. The method includes providing a first substrate having opposing first and second surfaces and forming a photoelectric structure in the first substrate with a conductivity type opposite to that of the first substrate. The photoelectric structure includes a second doped region and first doped regions. The first doped region is located on the surface of the second doped region. The size of the first doped region in a direction parallel to the first surface of the first substrate is smaller than or equal to the size of the second doped region in the direction parallel to the first surface of the first substrate. Thus, the PN junction area between the photoelectric structure and the first substrate is increased. The QE of the device is increased. The sensitivity of the image sensor is improved.

FIGS. 1-5 are schematic structural diagrams illustrating a fabrication process of an image sensor in an exemplary embodiment according to the present disclosure. Referring to FIG. 1, a first substrate 100 is provided. The first substrate 100 includes opposing first and second surfaces 100*a* and 100*b*.

The material of the first substrate 100 includes silicon, silicon germanium, silicon carbide, silicon on insulator (SOI), or germanium on insulator (GOI). In this embodiment, the exemplary material of the first substrate 100 is P-type silicon.

Optionally, the first substrate may include a base and an epitaxial layer formed over the base. The material of the epitaxial layer may include P-type silicon.

Figure 2:
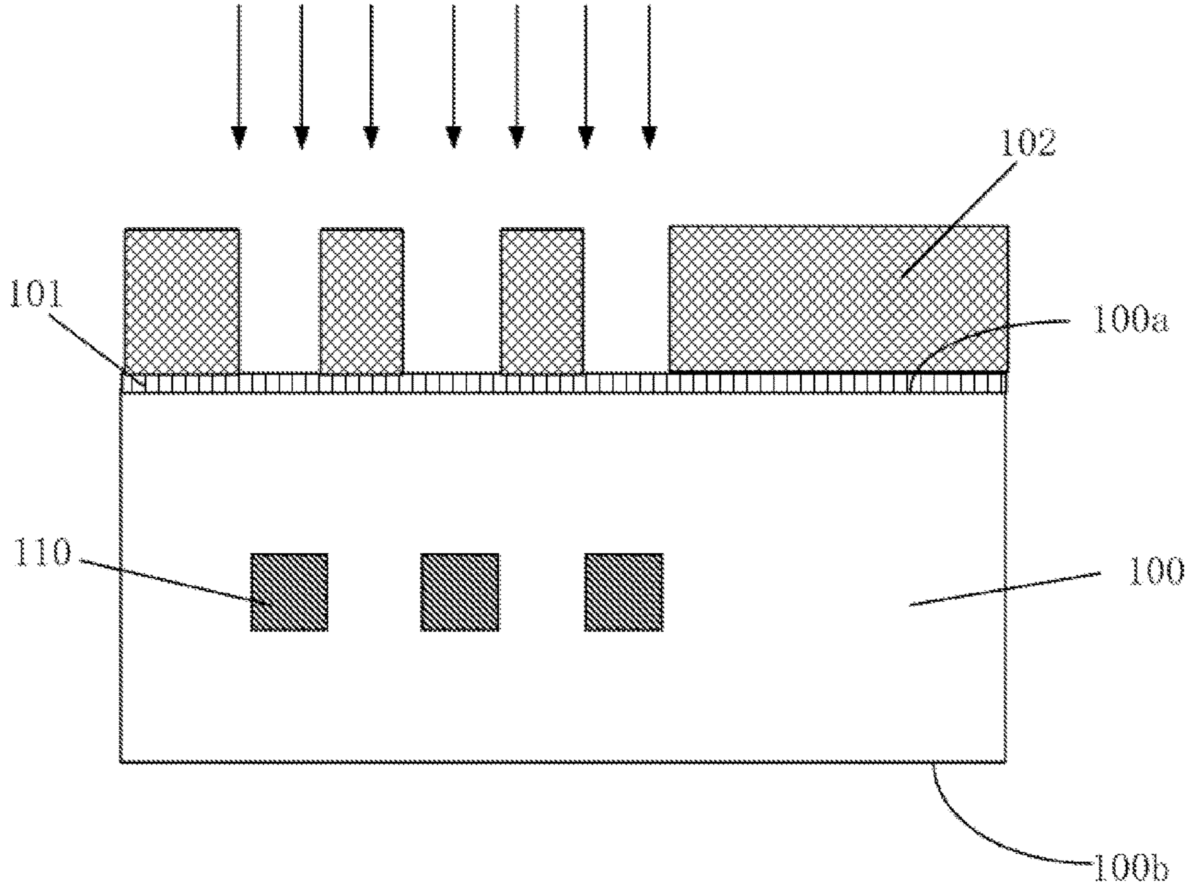

Referring to FIG. 2, an initial oxide layer 101 is formed over the first surface 100*a* of the first substrate 100. First initial doped regions (not shown) are formed over the first surface 100*a* of the first substrate 100 through a first ion implantation process. The first initial doped regions are annealed to form first doped regions 110. The conductivity type of the first doped region 110 is opposite to that of the first substrate 100.

An exemplary method of forming the first initial doped regions includes over the initial oxide layer 101, forming a first mask layer 102 exposing part of the surface of the initial oxide layer 101; and with the first mask layer 102 as a mask, performing ion implantation over the first surface 100*a* to form the first initial doped regions through a first ion implantation process.

Optionally, exemplary parameters of the first ion implantation process include an ion implantation dose of 4E12 ions/$cm^2$~6E12 ions/$cm^2$ and ion implantation energy of 450 KeV~550 keV. By controlling the ion implantation energy, the depth of the ion implantation may be controlled.

The first doped surface of the first doped regions 110 is parallel to the first surface. Exemplary parameters for annealing the first initial doped region include an annealing time of 5 to 15 seconds and an annealing temperature of 700 to 900 degrees Celsius. Optionally, by adjusting the time and temperature of the annealing process, the form of the surface of the first doped regions 110 may be adjusted.

Further, by adjusting the pattern of the first mask layer 102, the overall pattern of the first doped regions 110 may be adjusted. As such, the form and patterns of the first doped regions 110 are flexible, which is conducive to optimizing the QE of the image sensor.

Figure 3:
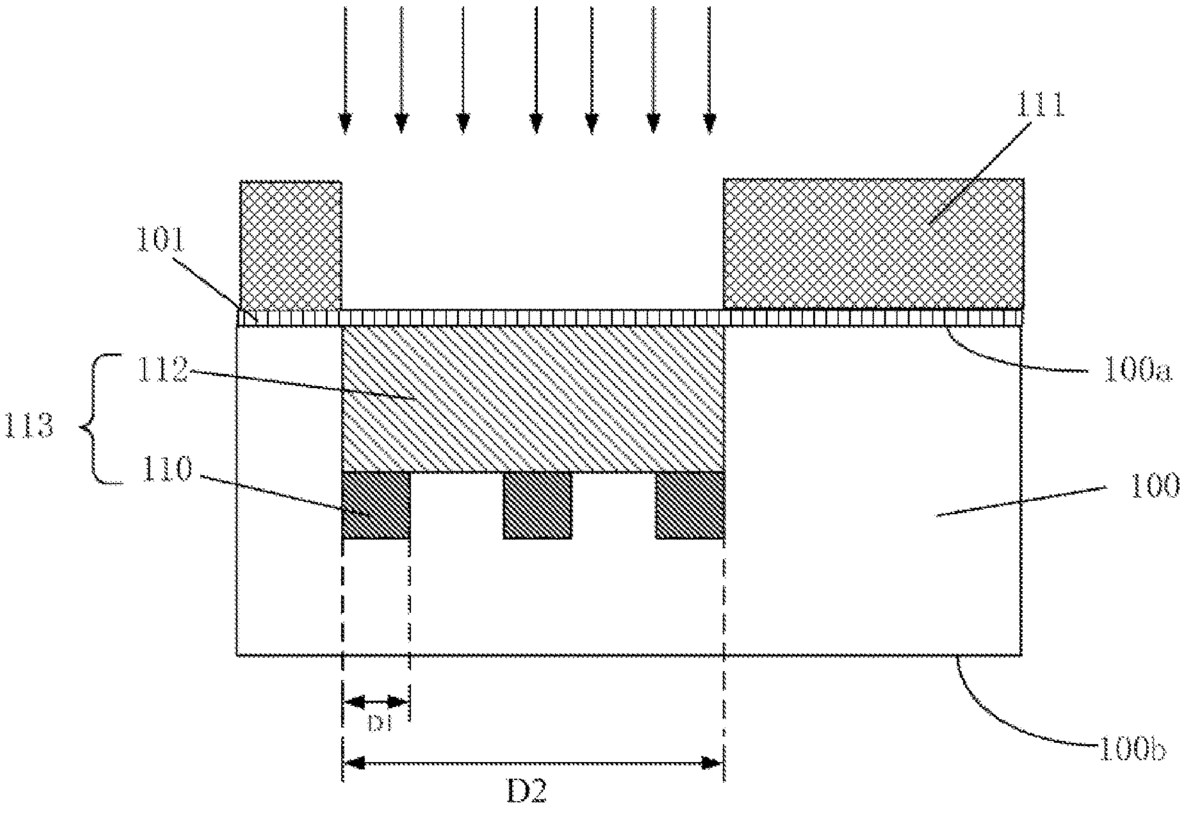

Referring to FIG. 3, a second initial doped region (not shown) is formed on the first surface 100*a* of the first substrate 100 through a second ion implantation process. The second initial doped region is annealed to form a second doped region 112.

The ion implantation energy of the first ion implantation process is greater than that of the second ion implantation process, such that the distance from the second doped region 112 to the first surface 100*a* is smaller than the distance from the first doped region 110 to the first surface 100*a*.

The conductivity type of the second doped region 112 is the same as that of the first doped regions 110. The second doped region 112 and the first doped regions 110 are both doped with N-type conductive ions. Exemplarily, the N-type conductive ions include phosphorus ions or arsenic ions.

Each of the first doped regions 110 is connected to the second doped region 112. A size D1 of the first doped regions 110 in a direction parallel to the first surface of the first substrate 100 is smaller than or equal to a size D2 of the second doped region 112 in the direction parallel to the first surface of the first substrate 100. The second doped region 112 and first doped regions 110 together form a photoelectric structure 113.

Optionally, the conductivity type of the photoelectric structure 113 and the first substrate 100 are opposite, and the two together form a photo-diode structure of the image sensor.

Since the conductivity type of the photoelectric structure 113 is opposite to that of the first substrate 100, a PN junction is formed in the interface between the photoelectric structure 113 and the first substrate 100. The larger the surface area of the PN junction, the stronger the first substrate 100's ability to absorb light. As the first doped regions 110 are on the surface of the second doped region 112, the surface area of the photoelectric structure 113 is increased. That is, the surface area of the PN junction is increased, which enhances the light absorption capability of the first substrate 100 and improves the QE of the image sensor.

Optionally, the method of forming the second initial doped region includes over the initial oxide layer 101, forming a second mask layer 111 exposing part of the surface of the initial oxide layer 101; and using the second mask layer 111 as a mask, performing ion implantation on the second surface **100*b*** to form the second initial doped region through a second ion implantation process.

By controlling the ion implantation energy in the first and second ion implantation processes respectively, the relative positions of the first doped regions 110 and second doped region 112 may be adjusted. The first doped regions 110 and the second doped region 112 are configured to be connected.

Exemplary parameters of the second ion implantation process include an ion implantation dose of 4E12 ions/$cm^2$~6E12 ions/$cm^2$ and ion implantation energy of 150 KeV~250 KeV.

Optionally, the size D1 of the first doped regions 110 in a direction parallel to the first surface of the first substrate 100 is greater than 0.12 microns, and less than or equal to half of the size D2 of the second doped region 112 in the direction parallel to the first surface of the first substrate 100.

Exemplary parameters for annealing the second initial doped region include an annealing time of 5 to 15 seconds and an annealing temperature of 700 to 900 degrees Celsius.

Alternatively, the first initial and second initial doped regions may be annealed together after the first and second initial doped regions are formed.

The surface of the first doped region 110 away from the second doped region 112 is a first doped surface. In the first doped regions 110 and second doped region 112 formed by the annealing process described above, the first doped surface of the first doped region 110 is parallel to the first surface **100*a***.

Figure 4:
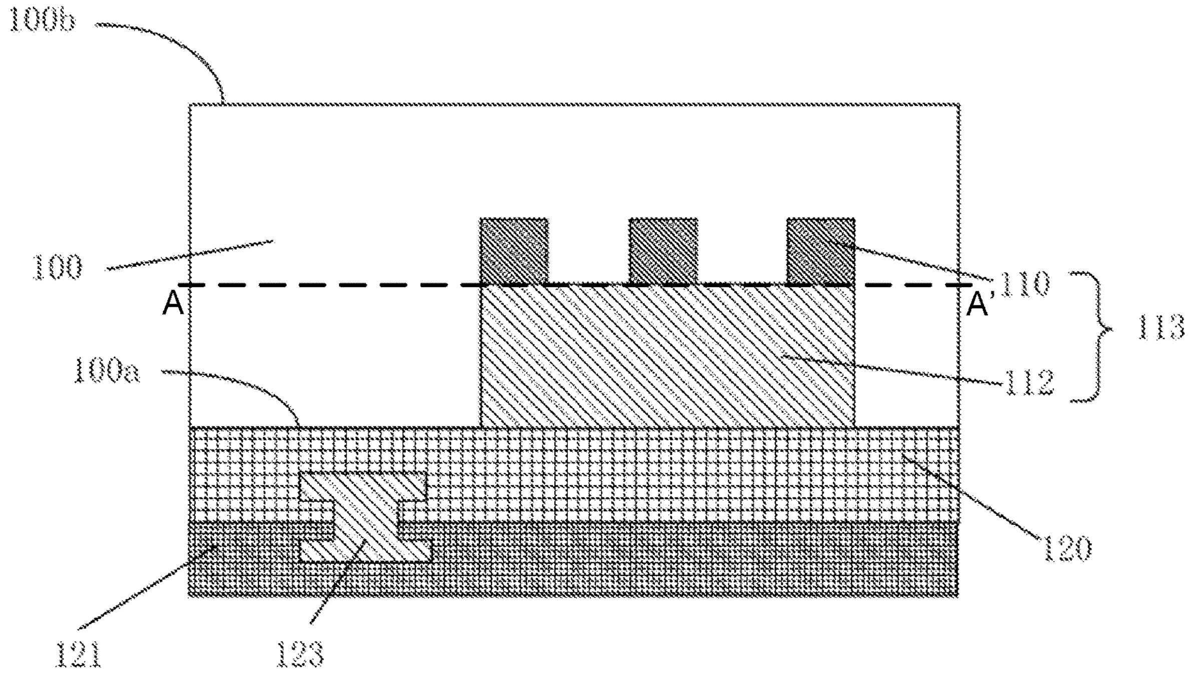

Referring to FIG. 4, a first device layer 120 is formed over the first surface **100*a* of the first substrate 100. The first device layer 120 has a first interconnection structure (not shown). Further, a second substrate 121 is provided. The second substrate 121 has a logic device area (not shown) and a second interconnection structure (not shown). The second substrate 121 is bonded with the first device layer 120**.

Optionally, the first device layer 120 has a transistor structure.

During the process to bond the second substrate 121 with the first device layer 120, the first and second interconnection structures are bonded to form an interconnection line layer 123. Thus, electrical interconnection between the first device layer 120 and the second substrate 121 is achieved.

Figure 5:
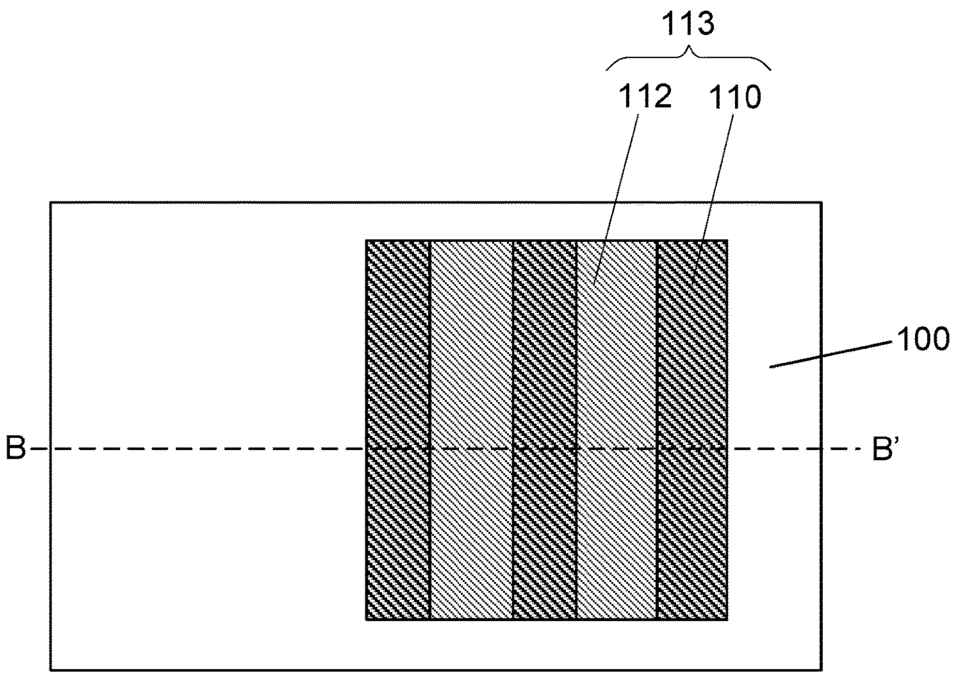

Referring to FIG. 5 in conjunction with FIG. 4. FIG. 4 is a schematic cross-sectional structural view of FIG. 5 along a BB' direction, and FIG. 5 is a schematic cross-sectional structural view of FIG. 4 along an AA' direction.

The number of the first doped regions 110 is greater than 1, and the first doped regions 110 are separated from each other. Projection patterns of the first doped regions 110 on the first surface of the first substrate 100 are the same in some embodiments.

Optionally, projection patterns of the first doped regions 110 on the first surface of the first substrate 100 are rectangles. The long sides of the rectangles are parallel to each other. In some other embodiments, the long sides of the rectangles may be parallel to each other or perpendicular to each other.

It should be noted that the first substrate 100 shown in FIG. 4 is omitted in FIG. 5.

Since the first doped regions 110 are on the surface of the second doped region 112, the surface area of the photoelectric structure 113 is increased. That is, the surface area of the PN junction is increased. It enhances the light absorption capability of the first substrate 100 and improves the QE of the image sensor. By forming the first doped regions 110, the QE of the image sensor may be effectively improved. Therefore, the second surface **100*b* of the first substrate 100 may not undergo any backside process. Keeping the second surface 100*b*** flat may also effectively improve the QE of the device. Substrate damage caused by the backside process may be avoided, the dark current may be reduced, and the device performance may be improved.

When the image sensor is in operation, light is incident on the second surface **100*b* of the first substrate 100. The first substrate 100** absorbs the light and a photoelectric effect occurs, thereby generating an electrical signal.

Figure 6:
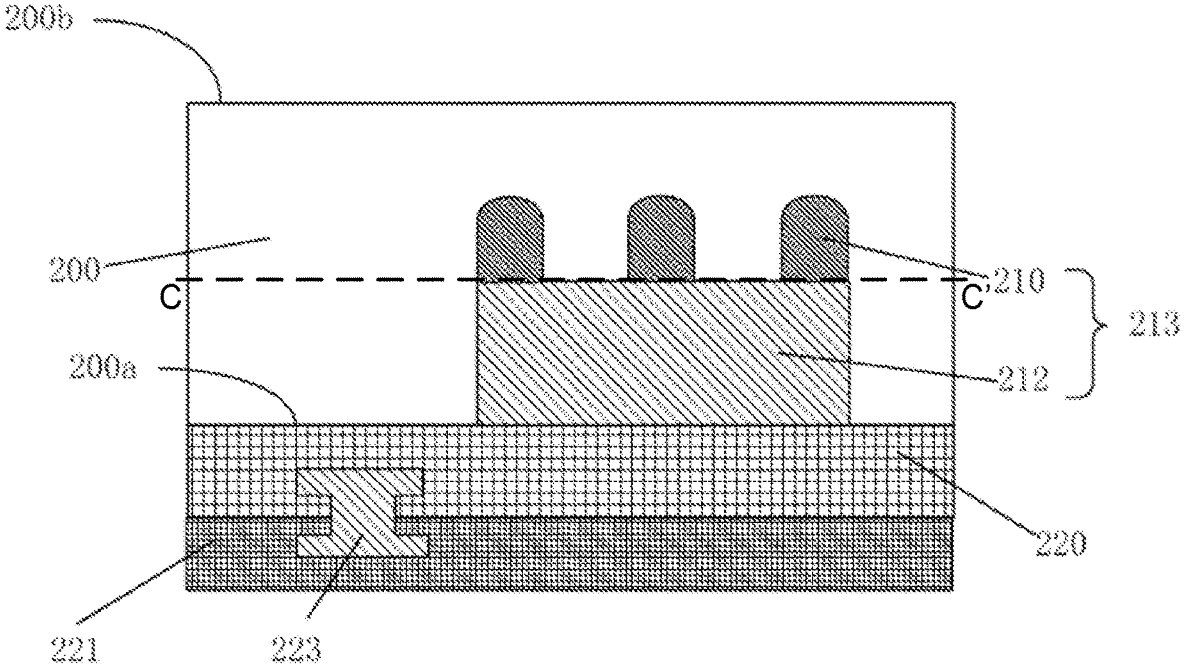
FIGS. 6-7 are structural diagrams illustrating a formation process of another exemplary image sensor according to some embodiments of the present disclosure.
Figure 7:
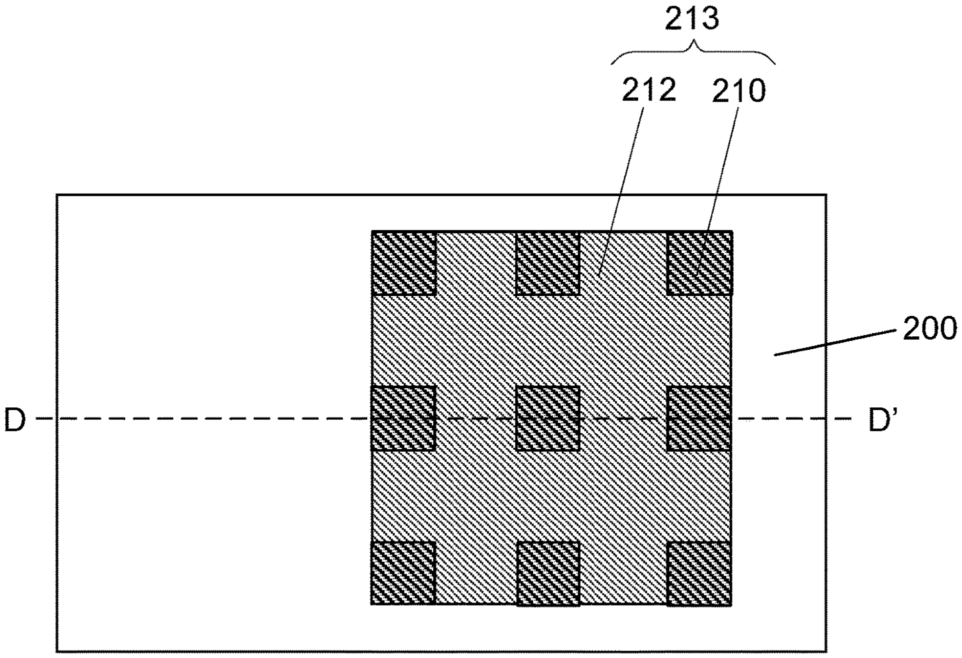

FIGS. 6 and 7 are schematic structural diagrams of a formation process of an image sensor in an exemplary embodiment according to the present disclosure. FIG. 6 is a schematic cross-sectional structural view of FIG. 7 along a DD' direction. FIG. 7 is a schematic cross-sectional structural view of FIG. 6 along a CC' direction.

Referring to FIGS. 6 and 7, the method of forming the image sensor includes providing a first substrate 200, wherein the first substrate 200 includes opposing first and second surfaces **200*a* and 200*b*; forming a photoelectric structure 213 in the first substrate 200, wherein the photoelectric structure 213 includes a second doped region 212 and first doped regions 210, and the conductivity type of the photoelectric structure 213 is opposite to that of the first substrate 200; forming a first device layer 220 on the first surface 200*a*, wherein a first interconnection structure (not shown) is formed in the first device layer 220; providing a second substrate 221, wherein the second substrate 221 contains a second interconnection structure (not shown); and bonding the second substrate 221 with the first device layer 220 with the second substrate 221 facing the first device layer 220, wherein the first and second interconnection structures are bonded to form an interconnection line layer 223**.

The surface of the first doped region 210 away from the second doped region 212 is a first doped surface. The first doped surface is convex toward the second surface **200*b***.

The formation method of the first doped regions 210 includes forming first initial doped regions (not shown) on the first surface 200*a* of the first substrate 200 through a first ion implantation process, and annealing the first initial doped regions to form the first doped regions 210. Exemplary parameters for annealing the first initial doped regions include an annealing time of 5 to 15 seconds and an annealing temperature of 900 to 1100 degrees Celsius. The first doped surface is convex toward the second surface 200*b*.

In some other embodiments, diffusion of dopant ions in the first doped region may be enhanced by extending the time of the annealing treatment or increasing the annealing temperature. As such, the first doped region is convex toward the second surface with a larger curvature, and the surface form of the first doped region may be adjusted through the process.

The number of the first doped regions 210 is greater than 1, and the first doped regions 210 are separated from each other. Projection patterns of the first doped regions 210 on the first surface of the first substrate 200 are the same in some cases.

Projection patterns of the first doped regions 210 on the first surface of the first substrate 200 include a square shape. It should be noted that the first substrate 200 in FIG. 6 is omitted in FIG. 7.

Figure 8:
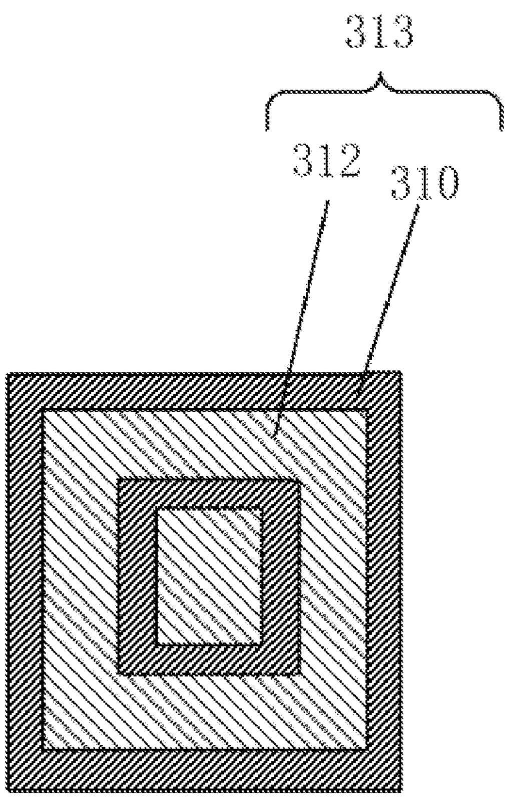
FIG. 8 is a top view of an exemplary photoelectric structure according to some embodiments of the present disclosure.

FIG. 8 is a top view of a photoelectric structure 313 of an image sensor in an exemplary embodiment according to the present disclosure. The view direction of FIG. 8 is consistent with that of FIG. 7.

Referring to FIG. 8, the photoelectric structure 313 includes a second doped region 312 and first doped regions 310. Projection patterns of the first doped regions 310 on a surface of a first substrate 300 are annular. The number of the first doped regions 310 is greater than 1. The first doped regions 310 are separated from each other.

In some embodiments, the formation method and location of other structures of the image sensor in the embodiment described in FIG. 8 may be referred to the formation methods and locations of the structures of the image sensor in the embodiment described in FIGS. 1 to 4, and will not be repeated herein.

Figure 9:
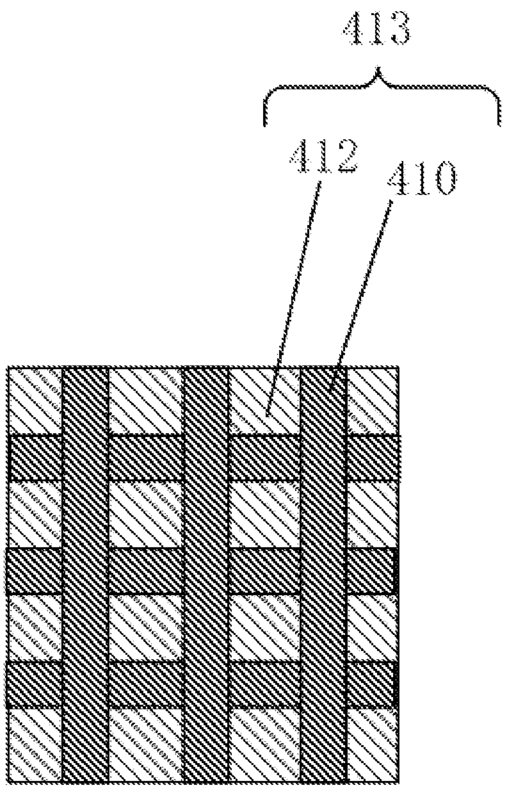
FIG. 9 is a top view of another exemplary photoelectric structure of an image sensor according to some embodiments of the present disclosure.

FIG. 9 shows a top view of a photoelectric structure 413 of an image sensor in an exemplary embodiment according to the present disclosure. The view direction of FIG. 9 is also consistent with FIG. 7.

Referring to FIG. 9, the photoelectric structure 413 includes a second doped region 412 and first doped regions 410. The number of the first doped regions 410 is greater than 1. Projection patterns of the first doped regions 410 on a surface of a first substrate 400 are rectangles. The long sides of the rectangles are parallel or perpendicular to each other such that the first doped regions 410 form a grid structure.

In some embodiments, the formation method and location of other structures of the image sensor in the embodiment illustrated in FIG. 9 may be consistent with the formation methods and locations of the structure of the image sensor in the embodiment illustrated in FIGS. 1 to 4, and will not be repeated herein.

In some other embodiments, projection patterns of the first doped regions on the surface of the first substrate also include a hexagon, an octagon, a circle, or a combination of the above shapes. The number of the first doped regions is greater than or equal to 1. Projection patterns of the first doped regions on the surface of the first substrate may be the same in some cases and different in some other cases. Hence, the pattern flexibility of the first doped regions is high. It is conducive to better optimizing QE, broadening the wavelength band that the image sensor can detect, and improving the device performance.

As illustrated above, the formation of the first doped regions increases the PN junction area between the photoelectric structure and the first substrate, thereby improving the QE of the device. Therefore, there is no need to form grooves through the backside process to increase the optical path in some embodiments. It may avoid substrate damages caused by the backside process, reduce the dark current, and improve the device performance. Further, by changing the pattern of the first mask layer, the number and shape of the first doped regions may be arranged in a variety of ways. In addition, by changing the annealing temperature and time in the formation process of the first doped regions, the curvature of the first doped surface of the first doped regions may be changed. This allows more possibilities for the structure, shape, and surface form of the first doped regions, thereby enabling more flexible control of the optical path on the photo-sensing surface of the image sensor. It is conducive to better optimizing the photon absorption rate of the photodiode in the device and improving the QE. Further, due to the flexible optical path arrangement on the photo-sensing surface of the device, the wavelength band that the image sensor can detect is broadened, and the device has increased QE in a wider wavelength band. Thus, the device performance may be improved.

Figure 10:
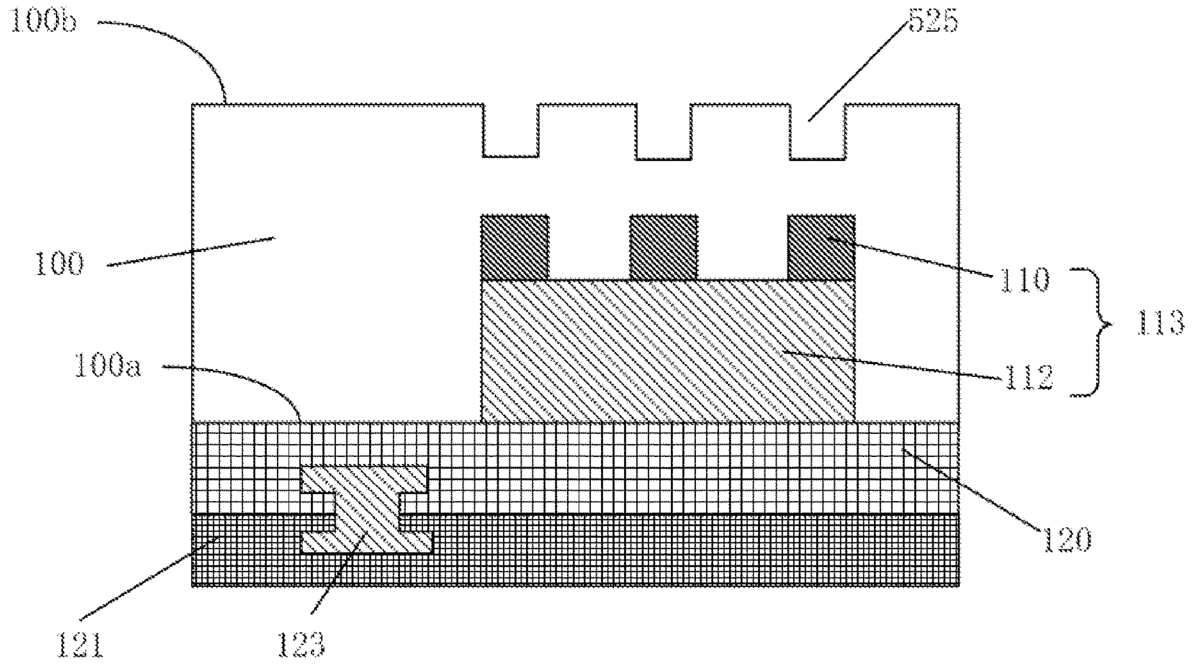
FIGS. 10 and 11 are structural diagrams illustrating a formation process of another exemplary image sensor according to some embodiments of the present disclosure.
Figure 11:
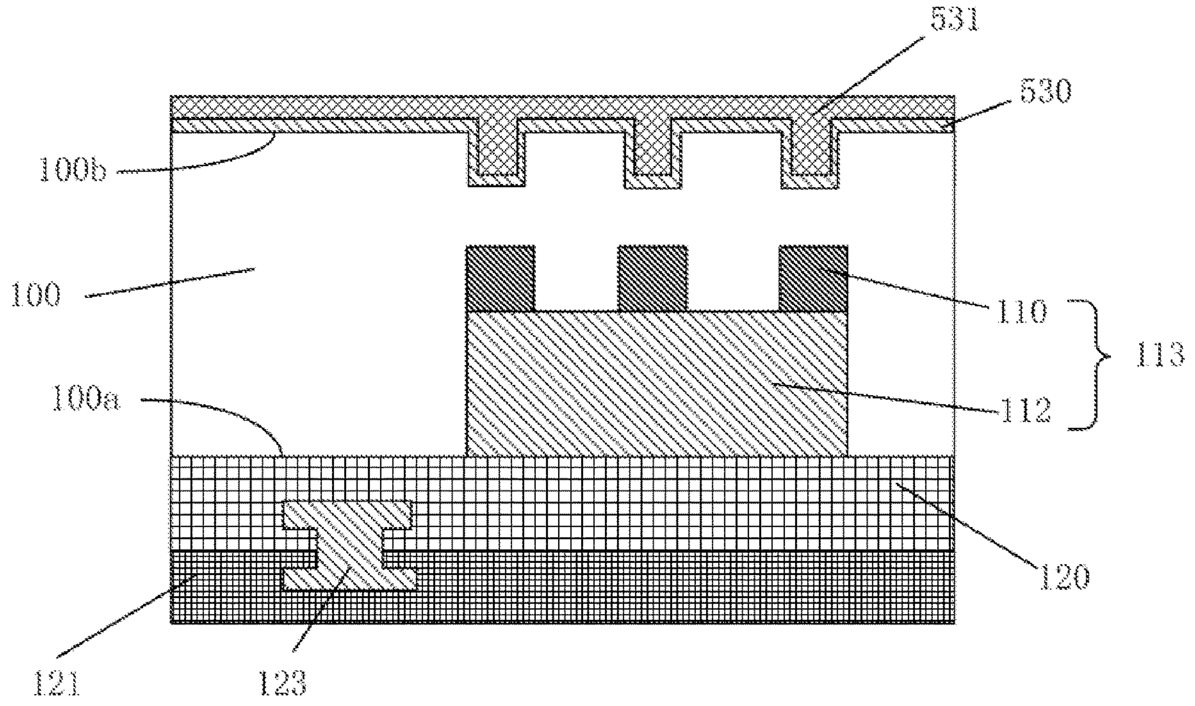

FIGS. 10 and 11 are structural diagrams illustrating a formation process of an image sensor in an exemplary embodiment according to the present disclosure. The structure shown in FIG. 10 may be based on the structure shown in FIG. 4. Micro-grooves 525 are formed on the second surface 100*b* of the first substrate 100. Referring to FIG. 10, the sidewall surface of the micro-grooves 525 is perpendicular to the second surface 100*b* of the first substrate 100. Optionally, the process of forming the micro-grooves 525 includes an anisotropic dry etching process.

During the process of etching the substrate to form the micro-grooves 525 through the anisotropic dry etching process, since the micro-groove 525 formation process has good directionality, the surface form of the micro-grooves 525 may be better controlled. Thus, the micro-grooves 525 may have fewer structural defects. Further, the dry etch process is tunable. The progress of the etch process may be adjusted by adjusting the etching gas. Thus, the surface form of the micro-grooves 525 may be arranged in a flexible manner.

Optionally, the formation method of the micro-grooves 525 includes forming a third mask layer (not shown) on the second surface 100*b*, wherein the third mask layer exposes part of the surface of the second surface 100*b*; and using the third mask layer as a mask to etch the first substrate 100 to form micro-grooves 525.

Optionally, the opening pattern of the third mask layer determines the overall pattern of the micro-grooves 525. By adjusting the opening pattern of the third mask layer, the overall pattern of the micro-grooves 525 may be adjusted. Therefore, the pattern of the micro-grooves 525 has high flexibility, which is beneficial to optimizing the QE of the image sensor.

In some cases, the etching gas of the dry etching process includes a fluorocarbon mixture. For example, the carbon to fluorine ratio range in the etching gas may be 1:1.5~1:2. Therefore, the bottom surface of the micro-grooves 525 may be arranged parallel to the second surface 100*b*.

In some other embodiments, the bottom form of the micro-grooves may be controlled by adjusting the carbon to fluorine ratio range in the etching gas. It may improve the flexibility of the micro-groove form.

In some cases, the bottom surface of the micro-grooves is convex toward the second surface. The carbon to fluorine ratio in the etching gas ranges from 1:2 to 1:4.

In some cases, the bottom surface of the micro-grooves is convex toward the first surface, and the carbon to fluorine ratio in the etching gas ranges from 1:1 to 1:1.5.

Optionally, the number of the micro-grooves 525 is greater than or equal to 1. Projection patterns of the micro-grooves 525 on the first surface of the first substrate 100 may be the same in some cases and different in some other cases. Projection patterns of the micro-grooves 525 on the first surface of the first substrate 100 include a rectangular shape, a square shape, or an annular shape.

Optionally, the projection pattern of the first doped region 110 on the first surface of the first substrate 100 is a first pattern. The projection pattern of the micro-grooves 525 on the first surface of the first substrate 100 is a second pattern. The first and second patterns may completely overlap in some cases.

In some embodiments, by adjusting patterns of the first and third mask layers, patterns of the first doped region and the micro-grooves may be adjusted accordingly. The first and second patterns may partially overlap in some cases. The first and second patterns may not overlap in some other cases.

Referring to FIG. 11, the micro-grooves 525 are filled with a first oxide layer 530 and a dielectric layer 531 on the first oxide layer 530.

In some cases, the material of the first oxide layer 530 includes silicon oxide. Optionally, the first oxide layer 530 and/or dielectric layer 531 together may serve as an anti-reflection coating, further increasing the QE of the image sensor.

In some cases, the material of the dielectric layer 531 includes aluminum oxide. The dielectric layer 531 may be arranged to reduce reflectivity by e.g., a certain thickness, thereby increasing the light absorption rate and optimizing the QE of the image sensor.

Since the process of forming the micro-grooves 525 includes an anisotropic dry etching process, the etching direction may be controlled flexibly, the final form of the micro-grooves 525 may be adjusted, and the bottom surface of the micro-grooves 525 may be parallel to the second surface 100*b*, convex toward the second surface 100*b*, or convex toward the first surface 100*a*. Thus, the surface form of the micro-grooves 525 has many possibilities.

Further, by adjusting the pattern of the third mask layer, the number of the micro-grooves 525 is greater than or equal to 1. Projection patterns of the micro-grooves 525 on the first surface of the first substrate 100 may be the same or different. Projection patterns of the micro-grooves 525 on the first surface of the first substrate 100 may include many shapes such as a rectangular, square, or ring shape.

Further, the projection pattern of the first doped region 110 on the first surface of the first substrate 100 is a first pattern, and the projection pattern of the micro-groove 525 on the first surface of the first substrate 100 is a second pattern. The first and second patterns may completely overlap, partially overlap, or not overlap in various cases, further increasing the flexibility of the image sensor structure.

Through combinations of surface forms, pattern shapes, and relative positions of the micro-grooves 525 and the first doped regions 110, the optical path on the photo-sensing surface of the image sensor may be controlled flexibly. It is conducive to better optimizing the photon absorption rate of the photodiode in the device and improving the QE. Further, due to the flexible optical path arrangement on the photo-sensing surface of the device, the wavelength band that the image sensor can detect is broadened, and the device has an enhanced QE in a wider wavelength band. Thus, the device performance is improved.

The present disclosure also provides an image sensor formed using the above method.

Referring to FIG. 4, the image sensor includes the first substrate 100 and photoelectric structure 113 located in the first substrate 100. The first substrate 100 includes a first surface 100*a* and a second surface 100*b* that are opposite to each other. The conductivity type of the photoelectric structure 113 is opposite to the conductivity type of the first substrate 100. The photoelectric structure 113 includes a second doped region 112 and first doped regions 110. Each of the first doped regions 110 is connected to the second doped region 112. The distance between the second doped region 112 and the first surface 100*a* is smaller than that between the first doped region 110 and the first surface 100*a*. The size of the first doped region 110 in a direction parallel to the first surface of the first substrate 100 is smaller than or equal to the size of the second doped region 112 in the direction parallel to the first surface of the first substrate 100.

Projection patterns of the first doped regions 110 on the first surface of the first substrate 100 may be the same in some cases and different in some other cases. Projection patterns of the first doped regions 110 on the first surface of the first substrate 100 include a rectangle, a square, or an annular shape. A surface of the first doped region 110 away from the second doped region 112 is a first doped surface. The first doped surface is parallel to the first surface 100*a* or convex toward the second surface 100*b*.

Optionally, the second surface 100*b* of the first substrate 100 is flat.

Since the first doped regions 110 are located on the surface of the second doped region 112, the PN junction area between the photoelectric structure 113 and the first substrate 100 is increased, and the QE of the device is improved. In addition, since the number, shape, and surface form of the first doped regions 110 may be arranged in many ways, the combination of the first doped regions 110 and the micro-grooves is highly flexible. Thus, the optical path on the photo-sensing surface of the image sensor may be controlled flexibly. It is conducive to better optimizing the QE, broadening the wavelength band that the image sensor can detect, and improving the device performance. Further, due to the existence of the first doped regions 110, the QE of the device may be improved. As such, the second surface 100*b* of the first substrate 100 may not undergo any backside process in some cases, and the second side 100*b* may remain flat. Therefore, damages to the first substrate 100 are reduced, the dark current is reduced, and the device performance is improved.

Referring to FIG. 10, in some embodiments, the image sensor further includes micro-grooves 525 located on the second surface 100*b* of the first substrate 100. The sidewall surface of the micro-grooves 525 is perpendicular to the second surface of the first substrate 100. The bottom surface of the micro-grooves 525 may be parallel to the second surface 100*b*, convex toward the second surface 100*b*, or convex toward the first surface 100*a*.

The number of micro-grooves 525 is greater than or equal to 1. Projection patterns of the micro-grooves 525 on the first surface of the first substrate 100 are the same in some cases and different in some other cases. Projection patterns of the micro-grooves 525 on the first surface of the first substrate 100 include a rectangular, a square, or an annular shape.

The projection pattern of the first doped region 110 on the first surface of the first substrate 100 is a first pattern. The projection pattern of the micro-groove 525 on the first surface of the first substrate 100 is a second pattern. The first and the second patterns may completely overlap, partially overlap, or not overlap in various cases.

Due to the bottom surface, shape, and relative position of the micro-grooves 525 to the first doped regions 110, there are many possibilities. The optical path on the photo-sensing surface of the image sensor may be controlled flexibly. It is conducive to better optimizing QE, broadening the wavelength band that the image sensor can detect, and improving device performance.

Further, certain structures and layers described above in the present disclosure may be formed by deposition techniques such as chemical vapor deposition (CVD), physical vapor deposition (PVD), or atomic layer deposition (ALD).

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. An image sensor, comprising:

a first substrate, the first substrate including a first surface and a second surface that are opposite to each other; and a photoelectric structure in the first substrate, wherein a conductivity type of the photoelectric structure is opposite to a conductivity type of the first substrate, the photoelectric structure includes a second doped region and a plurality of first doped regions, each of the plurality of first doped regions is connected to the second doped region, a distance from the second doped region to the first surface is smaller than a distance from one of the plurality of first doped regions to the first surface, and a size of the plurality of first doped regions in a direction parallel to the first surface of the first substrate is smaller than or equal to a size of the second doped region in the direction parallel to the first surface of the first substrate, wherein projection patterns of the plurality of first doped regions on the first surface of the first substrate include a rectangular shape, a square shape, or an annular shape.

2. The image sensor according to claim 1, further comprising:

a plurality of micro-grooves located on the second surface of the first substrate, wherein a bottom surface of the plurality of micro-grooves is parallel to the second surface, convex toward the second surface, or convex toward the first surface.

3. The image sensor according to claim 2, wherein projection patterns of the plurality of micro-grooves on the first surface of the first substrate are the same or different, and the projection patterns of the plurality of micro-grooves include a rectangular shape, a square shape, or an annular shape.

4. The image sensor to claim 2, wherein a projection pattern of one of the plurality of first doped regions on the first surface of the first substrate is a first pattern, a projection pattern of one of the plurality of micro-grooves on the first surface of the substrate is a second pattern, and the first and second patterns completely overlap, partially overlap, or do not overlap.

5. The image sensor according to claim 1, wherein a surface of the plurality of first doped region away from the second doped region is a first doped surface, and the first doped surface is parallel to the first surface or convex toward the second surface.

6. The image sensor according to claim 1, wherein the projection patterns of the plurality of first doped regions on the first surface of the first substrate are the same or different.

7. A method for forming an image sensor, comprising:

providing a first substrate, the first substrate including a first surface and a second surface that are opposite to each other; and forming a photoelectric structure in the first substrate, wherein a conductivity type of the photoelectric structure is opposite to a conductivity type of the first substrate, the photoelectric structure includes a second doped region and a plurality of first doped regions, each of the plurality of first doped regions is connected to the second doped region, a distance from the second doped region to the first surface is smaller than a distance from one of the plurality of first doped regions to the first surface, and a size of the plurality of first doped regions in a direction parallel to the first surface of the first substrate is smaller than or equal to a size of the second doped region in the direction parallel to the first surface of the first substrate, wherein projection patterns of the plurality of first doped regions on the first surface of the first substrate include a rectangular shape, a square shape, or an annular shape.

8. The method according to claim 7, wherein a surface of the plurality of first doped regions away from the second doped region is a first doped surface, and the first doped surface is parallel to the first surface or convex toward the second surface.

9. The method according to claim 7, wherein projection patterns of the plurality of first doped regions on the first surface of the first substrate are the same or different.

10. The method according to claim 9, wherein the projection patterns of the plurality of first doped regions on the first surface of the first substrate include a plurality of rectangles, and long sides of the plurality of rectangles are parallel or perpendicular to each other.

11. The method according to claim 7, wherein a formation method of the photoelectric structure includes:

forming a plurality of first initial doped regions on the first surface of the first substrate through a first ion implantation process;

annealing the plurality of first initial doped regions to form the plurality of first doped regions;

forming a second initial doped region on the first surface of the first substrate through a second ion implantation process; and annealing the second initial doped region to form the second doped region, wherein ion implantation energy of the first ion implantation process is different from ion implantation energy of the second ion implantation process.

12. The method according to claim 11, wherein parameters of the first ion implantation process include an ion implantation dose of 4E12 ions/cm$^2$~6E12 ions/cm$^2$ and/or ion implantation energy of 450 KeV~550 keV, and parameters of the second ion implantation process include an ion implantation dose of 4E12 ions/cm$^2$~6E12 ions/cm$^2$ and/or ion implantation energy of 150 KeV~250 KeV.

13. The method according to claim 11, wherein when a first doped surface of the plurality of first doped regions is parallel to the first surface, parameters for annealing the plurality of first initial doped regions include an annealing time of 5 seconds to 15 seconds and/or an annealing temperature of 700 to 900 degrees Celsius; and when the first doped surface of the plurality of first doped regions is convex toward the second surface, parameters for annealing the plurality of first initial doped regions include an annealing time of 5 to 15 seconds and/or an annealing temperature of 900 to 1100 degrees Celsius.

14. The method according to claim 7, further comprising:

forming a plurality of micro-grooves on the second surface of the first substrate, wherein a sidewall surface of the plurality of micro-grooves is perpendicular to the second surface of the first substrate, and a bottom surface of the plurality of micro-grooves is parallel to the second surface, convex toward the second surface, or convex toward the first surface.

15. The method according to claim 14, wherein a projection pattern of one of the plurality of first doped regions on the first surface of the first substrate is a first pattern, a projection pattern of one of the plurality of micro-grooves on the first surface of the first substrate is a second pattern, and the first and second patterns completely overlap, partially overlap, or do not overlap.

16. The method according to claim 14, wherein a process of forming the plurality of micro-grooves includes an anisotropic dry etch process, and an etching gas of the dry etch process includes a fluorocarbon mixture.

17. The method according to claim 16, wherein when the bottom surface of the plurality of micro-grooves is parallel to the second surface, a carbon to fluorine ratio in the etching gas ranges from 1:1.5 to 1:2; when the bottom surface of the plurality of micro-grooves is convex toward the second surface, the carbon to fluorine ratio in the etching gas ranges from 1:2 to 1:4; and when the bottom surface of the plurality of micro-grooves is convex toward the first surface, the carbon to fluorine ratio in the etching gas ranges from 1:1 to 1:1.5.

18. The method according to claim 14, wherein projection patterns of the plurality of micro-grooves on the first surface of the first substrate are the same or different, and the projection patterns include a rectangular shape, a square shape, or an annular shape.

19. The method according to claim 14, further comprising:

filling the plurality of micro-grooves with a first oxide layer and a dielectric layer over the first oxide layer.

20. The method according to claim 7, further comprising:

forming a first device layer over the first surface of the first substrate.

* * * * *